United States Patent [19]

Thomas

[11] Patent Number: 4,843,191
[45] Date of Patent: Jun. 27, 1989

[54] INTERCONNECTION TECHNIQUE USING DIELECTRIC LAYERS

[75] Inventor: Donald A. Thomas, Titusville, N.J.

[73] Assignee: American Telephone and Telegraph Company, AT&T Bell Laboratories, Murray Hill, N.J.

[21] Appl. No.: 125,975

[22] Filed: Nov. 27, 1987

[51] Int. Cl.$^4$ .............................................. H01R 4/00
[52] U.S. Cl. ................................... 174/88 R; 29/850; 156/65; 156/297; 156/299; 156/300; 156/305; 174/117 F; 174/117 FF; 228/179; 361/408
[58] Field of Search ................. 156/65, 300, 297, 305, 156/299; 29/850; 174/88 R, 117 F, 117 FF; 228/179; 361/408

[56] References Cited

U.S. PATENT DOCUMENTS

| | | | |
|---|---|---|---|
| 4,255,613 | 3/1981 | Ketchpel | 174/88 R |
| 4,385,202 | 5/1983 | Spinelli et al. | 174/68.5 |
| 4,472,762 | 9/1984 | Spinelli et al. | 361/386 |
| 4,546,406 | 10/1985 | Spinelli et al. | 361/386 |
| 4,652,970 | 3/1987 | Watari et al. | 361/385 |

*Primary Examiner*—John J. Gallagher
*Attorney, Agent, or Firm*—Roderick B. Anderson

[57] ABSTRACT

In accordance with one embodiment of the invention, a process for interconnecting the circuitry of two substrates comprises the step of terminating the circuitry on bonding pads that are arranged in parallel rows with the first row of each substrate being nearest an edge of the substrate. The bonding pads of the two first rows of the two substrates are joined by conductors of a dielectric tape that bridges the two substrates. The conductors overlap the edges of the dielectric tape and are organized to permit them to be bonded to corresponding bonding pads of the two substrates, for example, by soldering. The two second rows of bonding pads are joined by conductors on a second dielectric tape which is wide enough to cover two first rows of bonding pads and thereby provide electrical insulation. In like manner, successive tape layers are of progressively wider widths to provide insulation from interconnections beneath them, while permitting conductors carried by the tapes to overlap the edges and contact exposed bonding pads. In this manner, the principle of TAB bonding can be used for making connections to the bonding pads of chips without the need for arranging all of the bonding pads in a single row along the edge of the chip.

12 Claims, 3 Drawing Sheets

INTERCONNECTION TECHNIQUE USING DIELECTRIC LAYERS

TECHNICAL FIELD

This invention relates to processes for bonding conductors to bonding pads of a substrate.

BACKGROUND OF THE INVENTION

Electronic circuit systems are typically made by defining complex integrated circuit structures on semiconductor chips, bonding the chips to circuit package substrates, and in turn bonding the packages to printed circuit boards. The most common bonding technique is wire bonding, in which an instrument (a thermode) thermocompression bonds wire to a bonding pad of one element, such as a chip, and then pulls the wire and makes a bond on a bonding pad of a second element so as to form an arcuate self-supporting wire bridge between the two bonding pads.

An alternative to wire bonding which has found a substantial degree of commercial acceptance is tape automated (TAB) bonding, a technique described, for example, in the publication "The Basics of Tape Automated Bonding," *Hybrid Circuit Technology*, November 1984, Pages 15-21. In TAB bonding, a dielectric tape contains conductors to be bonded to a chip. The conductors overlap in cantilever fashion a window in the tape such as to match a row of bonding pads arranged on the periphery of the chip. Solder bumps on the ends of the conductors may be bonded by reflow soldering to the bonding pads of the chip. A dielectric tape may contain a large number of such windows which permits automated soldering of conductor arrays to successive chips. Opposite ends of the conductors may thereafter be bonded, for example, to a package substrate.

A trend that has been clear for a number of years in the integrated circuit field has been a steady increase in the density of conductors used on semiconductors chips, package substrates, and printed circuit boards. The bonding pads that must be used for making an interconnection between each conductor of one element and the circuitry of another element must typically be wider than the width of the conductors to accommodate the bonding process. Thus, there has been difficulty in arranging on the periphery of a chip, for example, all of the bonding pads needed for accommodating all of the conductors of the chip. If care is not taken in the proper organization of bonding pads, one obviously runs the risk of accidental short circuits. For example, in wire bonding, the wire interconnection may sag if designed to bridge too great a distance. TAB bonding assumes the organization of bonding pads in a peripheral array, which is inherently limiting.

SUMMARY OF THE INVENTION

Accordingly, the invention concerns a process for bonding conductors to bonding pads of an element comprising the steps of arranging a plurality of bonding pads in a first array, forming a plurality of first conductors on the first dielectric tape such that free ends thereof overlap an edge of the first tape and are configured in an array that corresponds to the first array, bringing the tape into proximity with the first array of bonding pads and bonding each of a plurality of free ends of the first conductors to a corresponding bonding pad of the first array. In accordance with the invention, the process is characterized in that a second array of bonding pads is located on the element adjacent the first array and opposite the first dielectric tape; a plurality of second conductors is formed on a second dielectric tape such that free ends thereof overlap an edge of the second tape and are configured in an array that corresponds to the second array; the second dielectric tape is overlaid upon the first conductors and the first array of bonding pads such as to cover all of the first array but none of the second array of bonding pads; and each of a plurality of the free ends of the second conductors is bonded to a bonding pad of the second array of bonding pads. In this manner, the problem of accommodating a high density of bonding pads is solved.

In accordance with one specific embodiment of the invention, a process for interconnecting in which the circuitry of two substrates comprises the step of terminating the circuitry on bonding pads that are arranged in parallel rows with the first row of each substrate being nearest an edge of the substrate. The bonding pads of the two first rows of the two substrates are joined by conductors of a dielectric tape that bridges the two substrates. The conductors overlap the edges of the dielectric tape and are organized to permit them to be bonded to corresponding bonding pads of the two substrates, for example, by soldering. The two second rows of bonding pads are joined by conductors on a second dielectric tape which is wide enough to cover two first rows of bonding pads and thereby provide electrical insulation. In like manner, successive tape layers are of progressively wider widths to provide insulation from interconnections beneath them, while permitting conductors carried by the tapes to overlap the edges and contact exposed bonding pads. In this manner, the principle of TAB bonding can be used for making connections to the bonding pads of chips without the need for arranging all of the bonding pads in a single row along the edge of the chip.

Various other embodiments and uses of the invention will be apparent from the consideration of the following detailed description taken in conjunction with the accompanying drawing.

DETAILED DESCRIPTION

Figure 1:
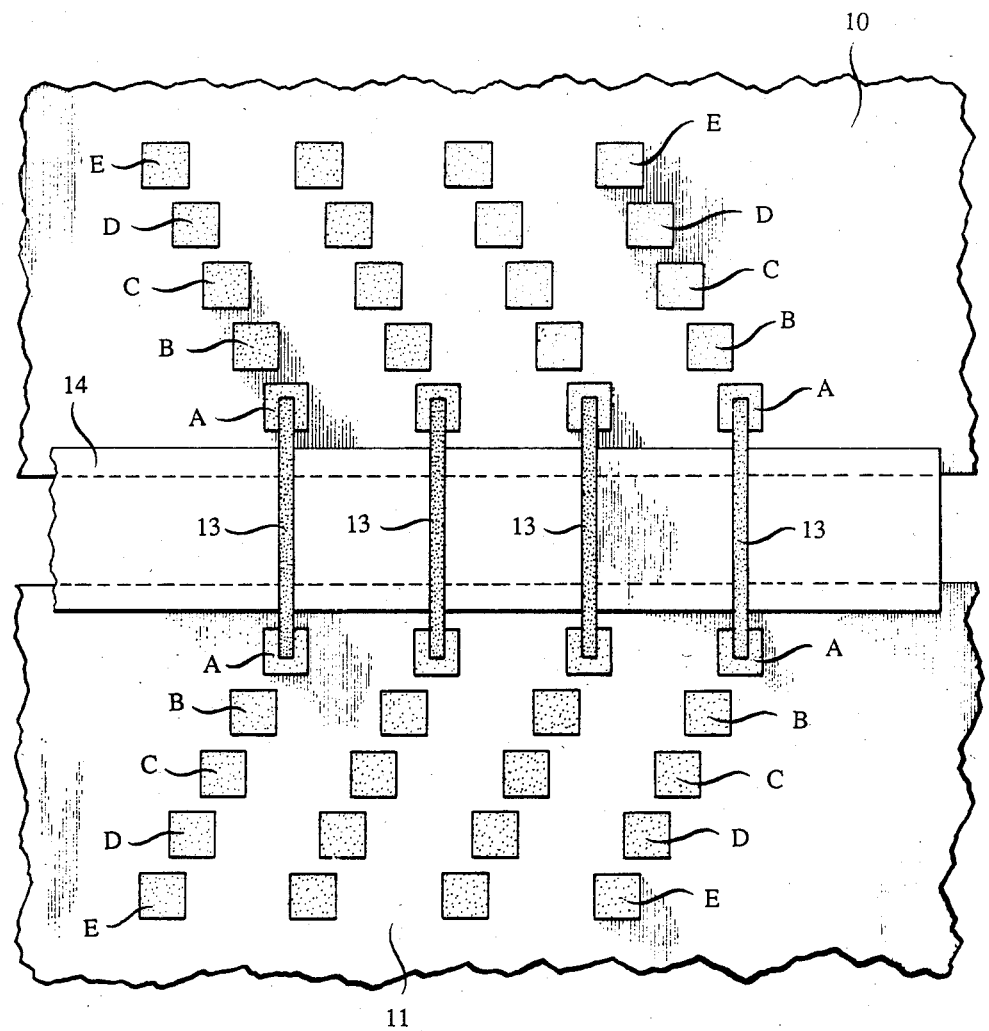
FIGS. 1, 2, and 3, respectively, illustrate successive steps in a process for interconnecting the bonding pads of two adjacent substrates.

Referring now to FIG. 1, there is shown two substrates 10 and 11 each containing electrical circuitry (not shown) which is to be interconnected. Substrate 10 may, for example, be a semiconductor chip while substrate 11 may be a circuit package substrate containing circuitry which one desires to connect permanently to the circuitry of the chip. Individual conductors of the circuitry of the two substrates terminate in bonding pads which are shown on the drawing as squares. The circuits of the two substrates are interconnected by interconnecting appropriate bonding pads of the two substrates.

The circuit conductors of the two substrates can typically be made of a much smaller width than that of the individual bonding pads. The bonding pads must typically be at least 4 mils (100 micrometers) square to ensure reliable bonding; whereas the conductors may typically have a width of only 1 micrometer and still give dependable electrical conduction. Moreover, to insure against accidental short-circuits, it is customary to have a significantly greater spacing between bonding pads than between circuit conductors. Thus, as the density of the circuitry increases, it becomes increasingly difficult to arrange all of the bonding pads along the edge or the periphery of a substrate.

In accordance with the present invention, the bonding pads of each of the two substrates are organized in parallel rows A-E such that proper interconnection between the circuits of the two substrates is made when a bonding pad of one substrate is interconnected to the corresponding bonding pad of the corresponding row of the other substrate. Corresponding bonding pads of the two A rows are interconnected by parallel conductors 13 which are formed on a dielectric tape 14. The dielectric tape has a width slightly smaller than the distance between row A of substrate 10 and row A of substrate 11. The ends of conductors 13 overlap opposite edges of dielectric tape 14 and are spaced such as to make contact with corresponding bonding pads of the two A rows of the two substrates. Thus, when positioned as shown in FIG. 1, the free ends of conductors 13 may conveniently be bonded to the bonding pads of the two A rows by any convenient process, such as reflow soldering or thermocompression bonding.

Preferably, the free ends of each conductor 13 includes "bumps" of solder which, after proper registration of the conductors 13 with the bonding pads, are melted and adhere to the bonding pads A through reflow soldering. The dielectric tape 14 may, for example, be Kapton (a trademark of the DuPont Company) which is commonly used as a dielectric tape in TAB bonding. In accordance with known TAB bonding principles, the conductors 13 may be adhered to the tape 14 either through use of an appropriate adhesive, or by a deposition technique known as sputtering. Reflow soldering is conventionally effected by contacting the free ends of the conductors 13 with a hot thermode. During the soldering, a fixture holds the tape 14 in place.

Figure 2:
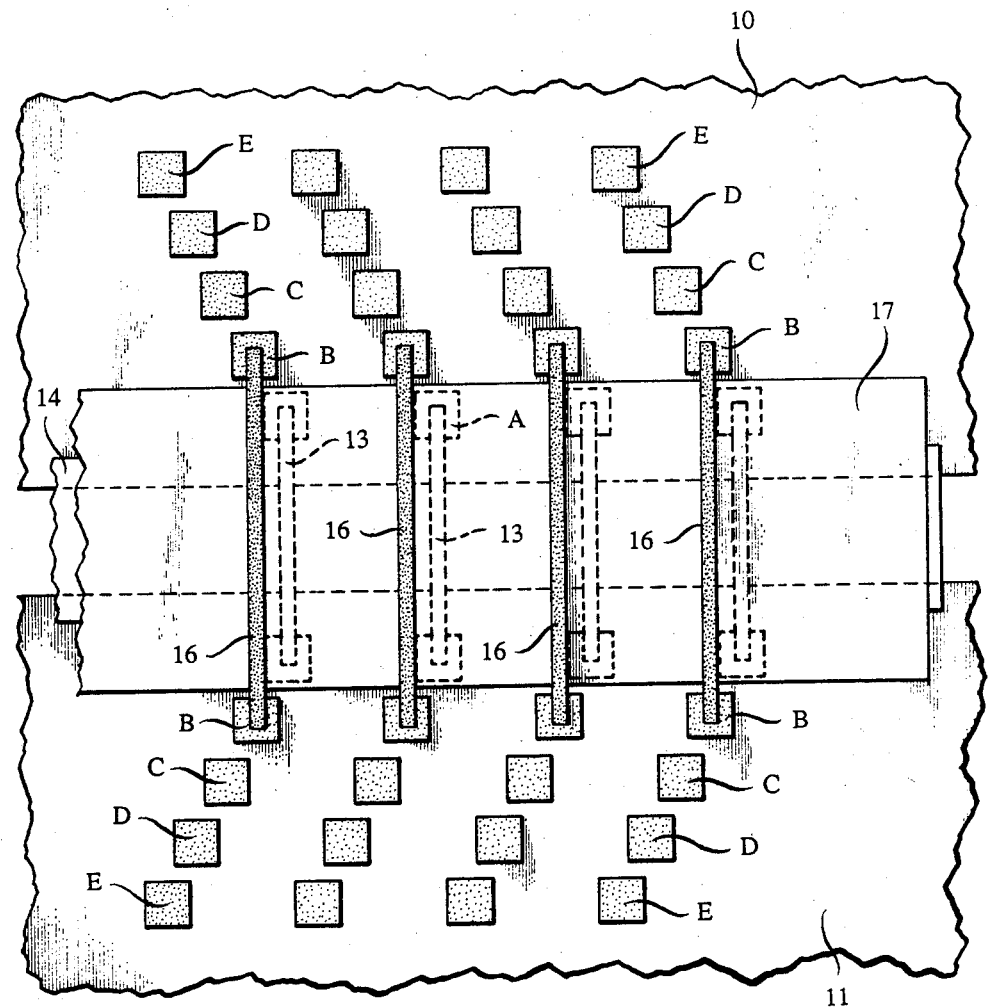

Referring to FIG. 2, after the bonding pads of rows A have been interconnected, bonding pads of rows B are interconnected by conductors 16 included on a dielectric tape 17. The dielectric tape is of sufficient width so as to overlie and cover completely the bonding pads of the two A rows and the conductors 13. Thus, the conductors 16 are electrically insulated from the bonding pads of rows A and conductors 13. As before, the conductors 16 overlap the edges of dielectric tape 17 and can thus be conveniently soldered to the bonding pads of row B of substrate 10 and row B of substrate 11.

In like manner, a successive layer of dielectric tape covers the bonding pads of rows B and carries conductors for interconnecting the C rows of the two substrates. Thereafter, the D rows of bonding pads are interconnected in the same manner.

Figure 3:
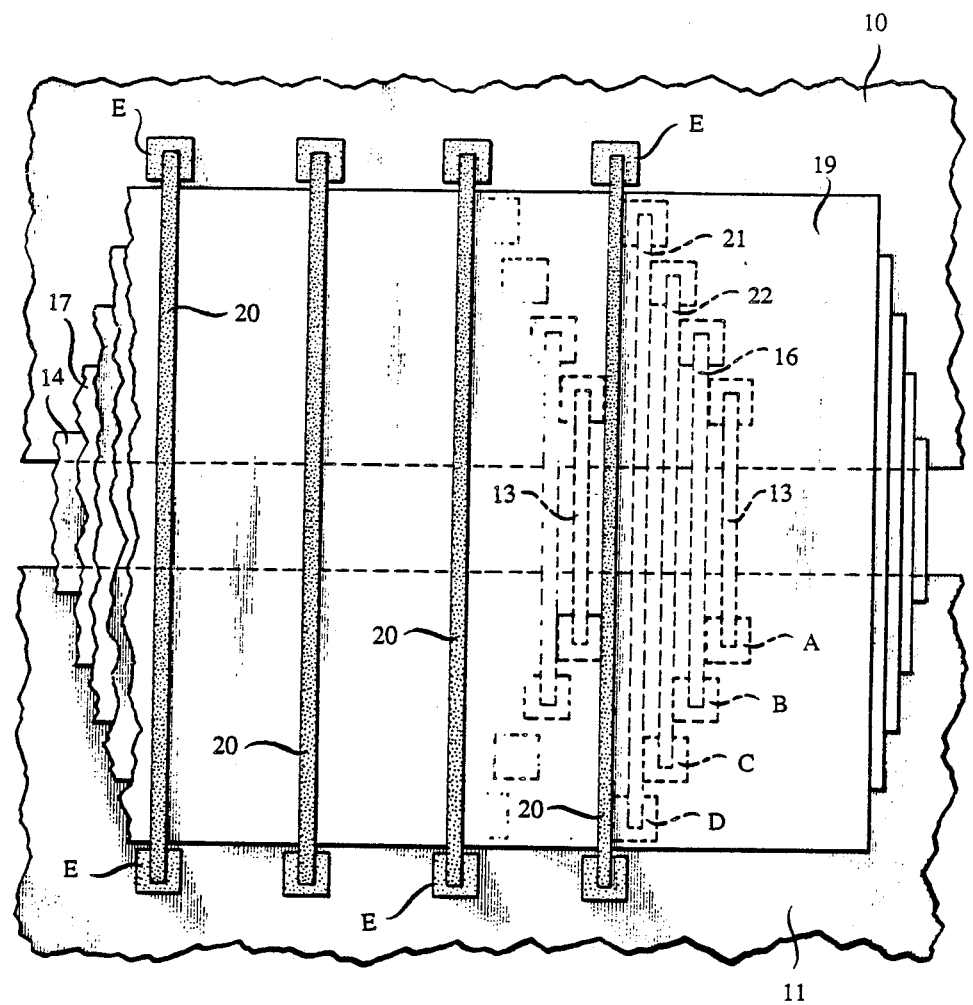

Referring to FIG. 3, there is shown the final dielectric tape 19 used to carry conductors 20 that interconnect the outer rows E of the two substrates. This final dielectric tape has a sufficient width to cover bonding pads A-D of the two substrates and associated interconnections. For purposes of completeness, conductors 21 for interconnecting the bonding pads of the D rows, conductors 22 for interconnecting the bonding pads of the C rows, conductors 16 for interconnecting the bonding pads of the B rows, and conductors 13 for interconnecting the bonding pads of A rows are all shown in phantom.

The bonding pads of each row may typically be made with a center-to-center spacing of 10 mils. The rows are preferably staggered as shown to prevent overlapping of the interconnecting conductors. Thus, the total thickness of the interconnection assembly is not significantly greater than that of conventional TAB bonding.

Another advantage of the invention is that one can easily inspect each of the bonds of the successive interconnection levels. That is, the dielectric tape doesn't obscure the conductors which are bonded at the time the bond is made; this would not be true for certain other bonding techniques in which there is no overlap by the conductors of the tape carrier.

While the invention has been shown as being used to interconnect the bonding pads of two substrates, it is to be understood that the bonding pads of substrate 10, for example, could be bonded as shown, but a completely different technique could be used for bonding the other ends of conductors to the bonding pads of substrate 11, or the other ends could themselves constitute circuitry. Various other embodiments, materials, and techniques may alternatively be used without departing from the spirit and scope of the invention.

What is claimed is:

1. A process for bonding conductors to bonding pads of an element comprising the steps of arranging a plurality of the bonding pads in a first array; each bonding pad having a significantly wider width than the width of a corresponding conductor;
    forming a plurality of first conductors on a first dielectric tape such that free ends thereof overlap an edge of the first tape and are configured in an array that corresponds to the first array;
    bringing the tape into proximity with one side of the first array of bonding pads; and
    bonding each of a plurality of the free ends of the first conductors to a corresponding bonding pad of the first array characterized in that
    a second array of bonding pads is located on the element on a side of the first array opposite the side on which the first dielectric tape is located;
    a plurality of second conductors is formed on a second dielectric tape such that free ends thereof overlap an edge of the second tape and are configured in an array that corresponds to the second array;
    the second tape being wider than the first tape;
    the second dielectric tape is overlaid upon the first conductors and the first array of bonding pads such as to cover all of the first array but none of the second array of bonding pads; and
    each of a plurality of the free ends of the second conductors is bonded to a bonding pad of the second array of bonding pads.

2. The process of claim 1 further characterized in that the first array of bonding pads is arranged in a first row along the element; and
    the second array of bonding pads is arranged in a second row that is parallel to the first row.

3. The process of claim 2 further characterized in that the bonding pads of the second row are staggered with respect to the bonding pads of the first row.

4. The process of claim 1 further characterized in that a third array of bonding pads is located on the element adjacent the second array and opposite the first and second dielectric tapes;
    a plurality of third conductors is formed on a third dielectric tape such that free ends thereof overlap an edge of the third tape and are configured in an array that corresponds to the third array;

the third tape being wider than the first tape;

the third tape is overlaid upon the second conductors and the second array of bonding pads such as to cover all of the second array but none of the third array of bonding pads; and each of a plurality of the free ends of the third conductors is bonded to a bonding pad of the third array.

5. The process of claim 4 further characterized in that the first, second, and third arrays of bonding pads are respectively arranged in first, second, and third rows on the substrate which are parallel but which are staggered with respect to each other.

6. The process of claim 3 further characterized in that bonding pads of a second element are arranged in fourth and fifth rows which are parallel but staggered with respect to each other;

free ends of the first conductors that are bonded to the first array of bonding pads overlap a second edge of the first dielectric tape and are each bonded to one of the fourth row of bonding pads on the second element;

the second dielectric tape is overlaid upon the fourth row of bonding pads such as to cover all of the fourth row but none of the fifth row of bonding pads; and free ends of the second conductors opposite the ends bonded to the second array overlap a second edge of the first dielectric tape and are each bonded to a bonding pad of the fifth row of bonding pads.

7. A process for interconnecting bonding pads of first and second bonding pad arrays comprising the steps of forming first conductors on a first dielectric tape such that the conductors overlap at least one edge of the first tape to have a configuration corresponding to the desired interconnections to the first array;

locating the first tape between the first and second arrays; and bonding selected first conductors to selected bonding pads of the first and second arrays characterized in that a third array of bonding pads is located adjacent the first array and a fourth array of bonding pads is located adjacent the second array such that the first and second arrays are located between the third and fourth arrays;

forming second conductors on a second dielectric tape such that the conductors overlap opposite edges of the second tape;

the second tape being wider than the first tape;

locating the second tape such that it covers the first tape, the first conductors and the first and second arrays of bonding pads;

bonding one end of each of the second conductors to bonding pads of the third array; and bonding opposite ends of the second conductors to bonding pads of the fourth array.

8. The process of claim 7 further characterized in that the first array of bonding pads is arranged in a first row along a first substrate;

the second array of bonding pads is arranged in a second row along a second substrate;

the third array comprises a row of bonding pads on the first substrate parallel to the first row; and the fourth array comprises a fourth row of bonding pads on the second substrate parallel to the second row.

9. The process of claim 8 further characterized in that the bonding pads of the third row are staggered with respect to the bonding pads of the first row and the bonding pads of the fourth row are staggered with respect to the bonding pads of the second row.

10. The process of claim 8 further characterized in that the first substrate contains a plurality of other rows of bonding pads parallel to the first and third rows;

the second substrate contains a plurality of other rows of bonding pads parallel to the second and fourth rows;

conductors carried on dielectric tapes are bonded to corresponding bonding pads of the first and second substrates such that each dielectric tape is progressively wider and completely covers the bonding pads of the first and second substrates that have been previously bonded.

11. The process of claim 7 further characterized in that the first and third arrays of bonding pads are formed on a first substrate;

the second and fourth arrays are formed on a second substrate;

the first substrate contains first circuitry comprising conductors that are each terminated at one of the bonding pads of first and third arrays;

the second substrate contains second circuitry comprising conductors that are each terminated at one of the bonding pads of the second and fourth arrays; and the process for bonding pads of the first and third arrays with bonding pads of the second and fourth arrays constitutes a process for interconnecting the first and second circuitries.

12. A product made by the process of claim 1.

* * * * *